(12) United States Patent
Chen et al.

(10) Patent No.: US 9,490,192 B1
(45) Date of Patent: Nov. 8, 2016

(54) SEMICONDUCTOR STRUCTURE AND MANUFACTURING METHOD THEREOF

(71) Applicant: TAIWAN SEMICONDUCTOR MANUFACTURING COMPANY LTD., Hsinchu (TW)

(72) Inventors: Ying-Ju Chen, Yunlin County (TW); Hsien-Wei Chen, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/984,395

(22) Filed: Dec. 30, 2015

(51) Int. Cl.
| H01L 23/48 | (2006.01) |
| H01L 23/52 | (2006.01) |
| H01L 29/40 | (2006.01) |
| H01L 23/00 | (2006.01) |
| H01L 23/31 | (2006.01) |
| H01L 23/532 | (2006.01) |
| H01L 21/56 | (2006.01) |
| H01L 21/768 | (2006.01) |

(52) U.S. Cl.
CPC .......... *H01L 23/481* (2013.01); *H01L 21/565* (2013.01); *H01L 21/76885* (2013.01); *H01L 23/3107* (2013.01); *H01L 23/53228* (2013.01); *H01L 24/13* (2013.01); *H01L 2224/02372* (2013.01); *H01L 2224/12105* (2013.01); *H01L 2224/13024* (2013.01); *H01L 2224/13025* (2013.01); *H01L 2224/13147* (2013.01); *H01L 2924/20641* (2013.01); *H01L 2924/20642* (2013.01)

(58) Field of Classification Search
CPC .................. H01L 23/481; H01L 2225/06541; H01L 2224/48145; H01L 23/5226; H01L 21/56; H01L 2224/023; H01L 23/49827

USPC ........ 257/784, 786, 758, 759; 438/622, 623, 438/637

See application file for complete search history.

(56) References Cited

U.S. PATENT DOCUMENTS

| 9,171,823 B2 * | 10/2015 | Gan ........................ H01L 24/24 |
| 2010/0155920 A1 * | 6/2010 | Lee ........................ H01L 25/105 257/686 |
| 2011/0260334 A1 * | 10/2011 | Hasegawa ............. H01L 21/481 257/774 |
| 2016/0013138 A1 * | 1/2016 | Chen ..................... H01L 21/768 257/774 |
| 2016/0086930 A1 * | 3/2016 | Koey .................. H01L 23/5389 257/773 |
| 2016/0133562 A1 * | 5/2016 | Lee ..................... H01L 23/5226 257/774 |

* cited by examiner

*Primary Examiner* — Sheila V. Clark
(74) *Attorney, Agent, or Firm* — WPAT, P.C., Intellectual Property Attorneys; Anthony King

(57) ABSTRACT

A semiconductor structure includes a through via, a molding surrounding the through via, a dielectric layer disposed over the die, the through via and the molding, and a conductive member disposed within the dielectric layer, disposed over the through via, and electrically connected with the through via, wherein the conductive member includes a first protruding portion and a second protruding portion, and the first protruding portion is laterally protruded from the through via along a first direction in a first length, and the second protruding portion is laterally protruded from the through via along a second direction in a second length, and the first direction is substantially orthogonal to the second direction, and the first length is substantially greater than the second length.

20 Claims, 13 Drawing Sheets

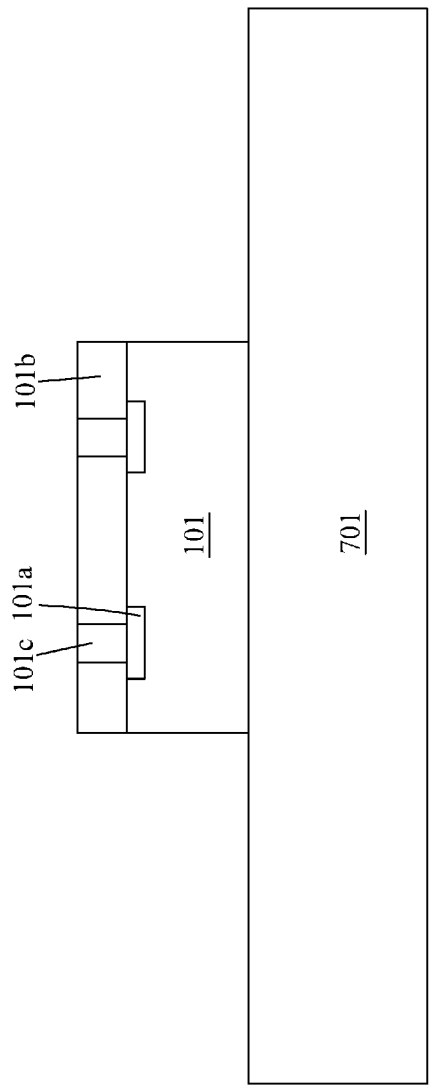
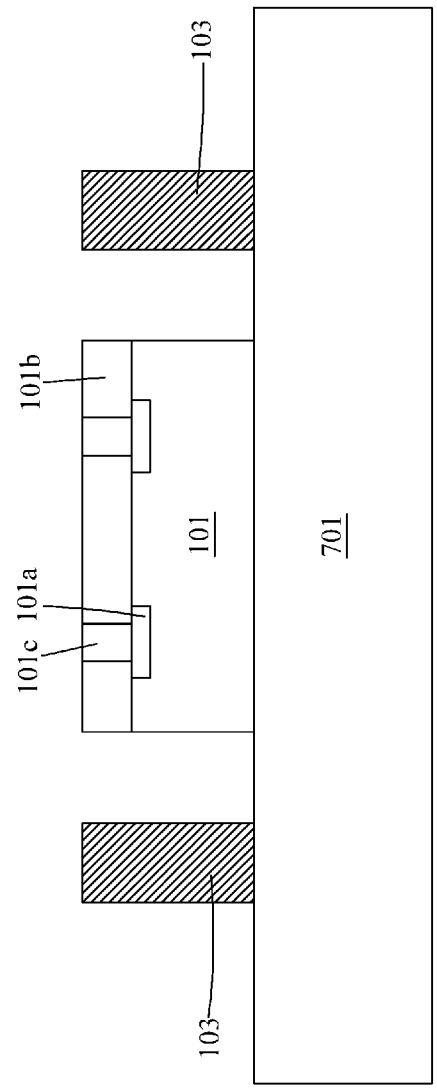
FIG. 11A
FIG. 11B

SEMICONDUCTOR STRUCTURE AND MANUFACTURING METHOD THEREOF

BACKGROUND

Electronic equipments using semiconductor devices are essential for many modern applications. With the advancement of electronic technology, the semiconductor devices are becoming increasingly smaller in size while having greater functionality and greater amounts of integrated circuitry. Due to the miniaturized scale of the semiconductor device, a wafer level packaging (WLP) is widely used for its low cost and relatively simple manufacturing operations. During the WLP operation, a number of semiconductor components are assembled on the semiconductor device. Furthermore, numerous manufacturing operations are implemented within such a small semiconductor device.

However, the manufacturing operations of the semiconductor device involve many steps and operations on such a small and thin semiconductor device. The manufacturing of the semiconductor device in a miniaturized scale becomes more complicated. An increase in a complexity of manufacturing the semiconductor device may cause deficiencies such as poor electrical interconnection, development of cracks, delamination of components, inaccurate placement of components or other issues, resulting in a high yield loss of the semiconductor device. The semiconductor device is produced in an undesired configuration, which would further exacerbate materials wastage and thus increase the manufacturing cost. As such, there are many challenges for modifying a structure of the semiconductor devices and improving the manufacturing operations.

The semiconductor device is assembled with numbers of integrated components including various materials with difference in thermal properties. Since more different components with different materials are involved, a complexity of the manufacturing operations of the semiconductor device is increased. There are more challenges to modify a structure of the semiconductor device and improve the manufacturing operations. As such, there is a continuous need to improve the manufacturing the semiconductor and solve the above deficiencies.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 11A-11H are schematic views of manufacturing a semiconductor structure by a method of FIG. 11 in accordance with some embodiments of the present disclosure.

DETAILED DESCRIPTION OF THE DISCLOSURE

Figure 1:
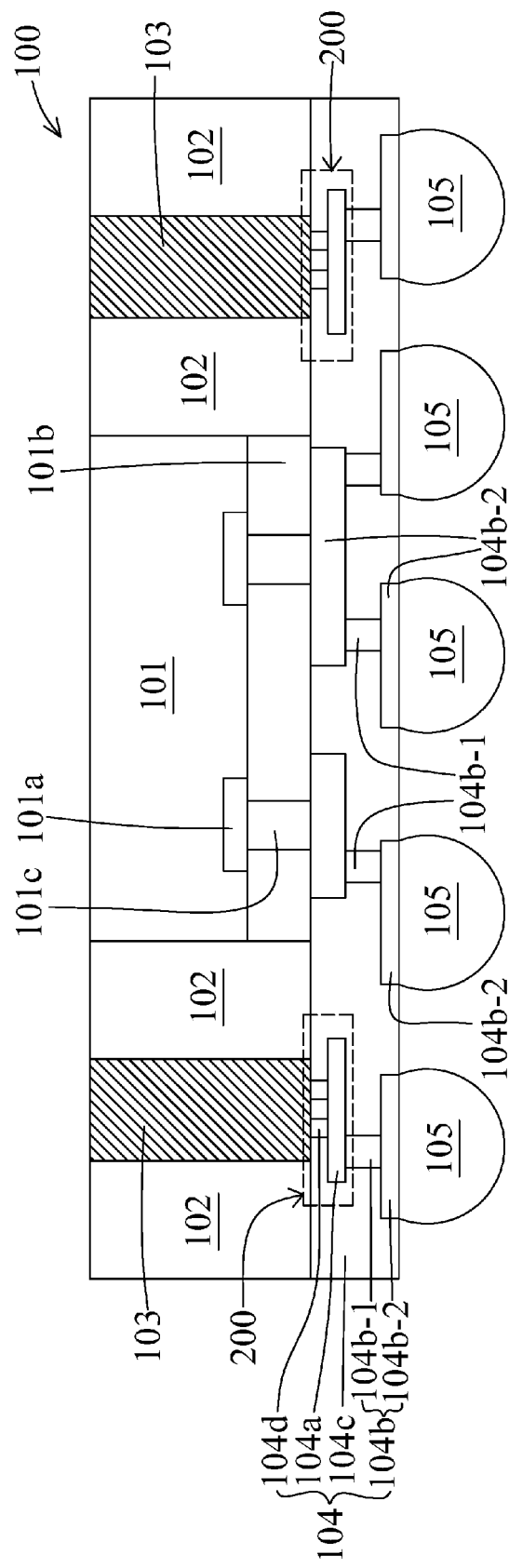
FIG. 1 is a schematic cross sectional view of a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A die is fabricated and singulated from a semiconductive wafer. After singulation, the die is packaged to become a semiconductor package and integrated with another die or package. The die is encapsulated by a molding, and I/O terminals of the die are routed out through conductive lines or other conductive structures. Several isolation layers are disposed over the die and the molding, and the conductive lines route out the I/O terminals within the isolation layers. Such configuration of the semiconductor package involves different kinds of materials (e.g. the die, the molding, the isolation layers, the conductive structures, etc.) with different thermal properties (e.g. different coefficient of thermal expansion (CTE), etc.). An internal stress would be easily developed between materials during subsequent thermal processes such as heat treatment, reflowing, etc.

Such a mismatch of CTE would cause cracks developed within the semiconductor package. The cracks can even propagate through the semiconductor package during subsequent manufacturing operations. The propagation of the cracks would further weaken configuration of the semiconductor package and the electrical connection between the die and the conductive lines, and ultimately results in a poor reliability or failure of the semiconductor package.

In the present disclosure, a semiconductor structure with improvement is disclosed. The semiconductor structure includes a through via extending through a molding and a conductive member electrically connected with and disposed over the through via with a predetermined shape and in a predetermined orientation. Such configuration of the conductive member can reduce an internal stress of the semiconductor structure, and thus minimize or prevent a development of crack around the conductive member. A reliability or performance of the semiconductor structure is improved.

FIG. 1 is a schematic cross sectional view of a semiconductor structure 100 in accordance with various embodiments of the present disclosure. In some embodiments, the semiconductor structure 100 includes a die 101, a molding 102, a through via 103 and a redistribution layer (RDL) 104. In some embodiments, the semiconductor structure is a semiconductor package. In some embodiments, the semiconductor structure 100 is an integrated fan out (InFO) package, that I/O terminals of the die 101 are fanned out and redistributed over a surface of the die 101 in a greater area.

In some embodiments, the die 101 is a piece including semiconductive materials such as silicon, and is fabricated with a predetermined functional circuit within the die 101 produced by photolithography operations. In some embodiments, the die 101 is singulated from a semiconductive wafer by a mechanical or laser blade. In some embodiments, the die 101 comprises a variety of electrical circuits suitable for a particular application. In some embodiments, the electrical circuits include various devices such as transistors, capacitors, resistors, diodes and/or the like. In some embodiments, the die 101 comprises of any one of various known types of semiconductor devices such as memories (such as SRAMS, flash memories, etc.), microprocessors, application-specific integrated circuits (ASICs), digital signal processors (DSPs), or the like. In some embodiments, the die 101 is a logic device die, central computing unit (CPU) die, transceiver die, or the like. In some embodiments, the die 101 is a system on chip (SOC) that integrates all electronic components into a single die. In some embodiments, the die 101 has a top cross section (a cross section from a top view of the semiconductor structure) in a quadrilateral, a rectangular or a square shape. FIG. 1 illustrates the semiconductor structure 100 includes one die, however it is understood that the semiconductor structure 100 can include more than one dies. It is not intended to limit a number of dies in the semiconductor structure 100.

In some embodiments, a die pad 101a is disposed over a surface of the die 101 or within the die 101. In some embodiments, the die pad 101a is disposed over an active side of the die 101. FIG. 1 illustrates only two die pads 101a over the die 101 for clarity and simplicity, however, an ordinarily skilled person in the art would readily understand that one or more die pads 101a can be present over the die 101.

In some embodiments, the die pad 101a is electrically connected with a circuitry external to the die 101, so that a circuitry internal to the die 101 electrically connects with the circuitry external to the die 101 through the die pad 101a. In some embodiments, the die pad 101a is configured to electrically couple with a conductive trace or a conductive structure, so that the circuitry internal to the die 101 can electrically connect with the circuitry external to the die 101 from the die pad 101a through the conductive trace. In some embodiments, the die pad 101a includes gold, silver, copper, nickel, tungsten, aluminum, palladium and/or alloys thereof.

In some embodiments, a passivation 101b is disposed over the die pad 101a and the surface of the die 101. In some embodiments, the passivation 101b is patterned such that a portion of the die pad 101a is exposed from the passivation 101b for electrical connection with the circuitry external to the die 101. In some embodiments, the passivation 101b partially covers a top surface of the die pad 101a. The passivation 101b is configured for providing an electrical insulation and a moisture protection for the die 101, so that the die 101 is isolated from ambient environment.

In some embodiments, the passivation 101b includes dielectric material such as silicon oxide, silicon carbide, silicon oxynitride, silicon nitride or the like. In some embodiments, the passivation 101b includes dielectric material such as polymer, polybenzoxazole (PBO), polyimide, benzocyclobutene (BCB), or the like. In some embodiments, the passivation 101b is a single layer or more than one layers of dielectric materials disposed over each other.

In some embodiments, a conductive post 101c is disposed over the die pad 101a and surrounded by the passivation 101b. FIG. 1 illustrates only two conductive posts 101c disposed over the die 101 for clarity and simplicity, however, an ordinarily skilled person in the art would readily understand that more conductive posts 101c can be present over the die 101. In some embodiments, the conductive post 101c is disposed over the exposed portion of the die pad 101a and electrically connected with the circuitry of the die 101 through the die pad 101a. In some embodiments, the conductive post 101c is configured to electrically connect with another conductive structure.

In some embodiments, the conductive post 101c is surrounded by the passivation 101b including polymeric material such as PBO. In some embodiments, the conductive post 101c is extended through the passivation 101b. In some embodiments, the conductive post 101c includes metal such as copper, gold, aluminum, etc. In some embodiments, the conductive post 101c is in a cylindrical shape. In some embodiments, a top cross section (a cross section from a top view of the semiconductor structure) of the conductive post 101c is in various shapes such as circular shape, quadrilateral shape or polygonal shape.

In some embodiments, the semiconductor structure 100 includes the molding 102 surrounding the die 101. In some embodiments, the molding 102 surrounds the die pad 101a, the passivation 101b and the conductive post 101c. In some embodiments, the molding 102 is disposed adjacent to the die 101. In some embodiments, the molding 102 can be a single layer film or a composite stack. In some embodiments, the molding 102 includes various materials, such as molding compound, molding underfill, epoxy, resin, or the like. In some embodiments, the molding 102 has a high thermal conductivity, a low moisture absorption rate and a high flexural strength. In some embodiments, the molding 102 has a thickness of about 100 um to about 500 um.

In some embodiments, the semiconductor structure 100 includes the through via 103 disposed adjacent to the die 101 and surrounded by the molding 102. In some embodiments, the through via 103 is a through integrated fan out via (TIV) extending through the molding 102. FIG. 1 illustrates only two through vias 103 for clarity and simplicity, however, an ordinarily skilled person in the art would readily understand that more through vias 103 can be present in the semiconductor structure 100.

In some embodiments, the through via 103 is disposed within the molding 102. In some embodiments, the molding 102 fills a space between the die 101 and the through via 103. In some embodiments, the through via 103 includes conductive material such as gold, silver, copper, nickel, tungsten, aluminum, tin and/or alloys thereof. In some embodiments, the through via 103 is in a cylindrical shape. In some embodiments, the through via 103 has a top cross section (a cross section from a top view of the semiconductor structure) in a circular, rectangular, quadrilateral or polygonal shape. In some embodiments, a width of the top cross section of the through via 103 is about 150 um to about 220 um. In some embodiments, the width of the top cross section of the through via 103 is about 190 um to about 200 um. In some embodiments, the through via 103 has a height of about 100 um to about 500 um. In some embodiments, the height of the through via 103 is substantially same as the thickness of the molding 102.

In some embodiments, the semiconductor structure 100 includes the RDL 104 disposed over the die 101, the molding 102 and the through via 103. In some embodiments, the RDL 104 re-routes a path from the die pad 101a, so as to redistribute I/O terminals of the die 101 over the molding 102. In some embodiments, the RDL 104 includes a conductive structure 104b and a dielectric layer 104c surrounding the conductive structure 104b. In some embodiments, the conductive structure 104b includes conductive material such as gold, silver, copper, nickel, tungsten, aluminum, palladium and/or alloys thereof. In some embodiments, the dielectric layer 104c is disposed over the die 101, the molding 102 and the through via 103. In some embodiments, the dielectric layer 104c includes dielectric material such as silicon oxide, silicon nitride, silicon carbide, silicon oxynitride or the like.

In some embodiments, the conductive structure 104b is disposed within the dielectric layer 104c. In some embodiments, the conductive structure 104b is configured to electrically connect the circuitry of the die 101 with a circuitry external to the die 101 through the die pad 101a or the conductive post 101c. In some embodiments, the conductive structure 104b is configured to electrically connect with the through via 103. In some embodiments, the conductive structure 104b is configured to electrically connect the die 101 and the through via 103. In some embodiments, the conductive structure 104b is configured to electrically connect the die pad 101a or the conductive post 101c with the through via 103.

In some embodiments, the conductive structure 104b includes a via portion 104b-1 and a land portion 104b-2. In some embodiments, the via portion 104b-1 is extended through the dielectric layer 104c. In some embodiments, the via portion 104b-1 is vertically extended from the land portion 104b-2. In some embodiments, the land portion 104b-2 is disposed over and electrically connected with the die pad 101a or the conductive post 101c. In some embodiments, the land portion 104b-2 is disposed over a surface of the dielectric layer 104c and is configured to electrically connect with other conductive structure.

In some embodiments, a conductive member 104a is disposed over the through via 103. In some embodiments, the conductive member 104a is a part of the RDL 104. In some embodiments, the conductive member 104a is surrounded by the dielectric layer 104c. In some embodiments, the conductive member 104a is disposed over the through via 103 and the molding 102. In some embodiments, the conductive member 104a is electrically connected with the conductive structure 104b. In some embodiments, the conductive member 104a is electrically connected with the land portion 104b-2 through the via portion 104b-1. In some embodiments, the conductive member 104a includes gold, silver, copper, nickel, tungsten, aluminum, palladium and/or alloys thereof. In some embodiments, the conductive member 104a includes same or different material from the conductive structure 104b. In some embodiments, the conductive member 104a has a width of greater than about 200 um. In some embodiments, the width of the conductive member 104a is about 180 um to about 250 um.

In some embodiments, a conductive pillar 104d is disposed between the through via 103 and the conductive member 104a. In some embodiments, the conductive pillar 104d is a part of the RDL 104 or is a part of the conductive member 104a. In some embodiments, the conductive pillar 104d extends between the through via 103 and the conductive member 104a to electrically connect the through via 103 with the conductive member 104a. In some embodiments, the conductive pillar 104d is integrally formed with the conductive member 104a. In some embodiments, the conductive pillar 104d includes gold, silver, copper, nickel, tungsten, aluminum, palladium and/or alloys thereof. In some embodiments, the conductive pillar 104d includes same or different material from the conductive member 104a.

In some embodiments, the land portion 104b-2 is disposed over the surface of the dielectric layer 104c and is configured to electrically connect with a conductive bump 105. In some embodiments, the land portion 104b-2 is configured to receive the conductive bump 105. In some embodiments, the land portion 104b-2 is configured to receive a bump pad such as under bump metallization (UBM) pad, and the bump pad is configured to receive the conductive bump 105. In some embodiments, the die pad 101a is electrically connected with the conductive bump 105 through the land portion 104b-2 and the via portion 104b-1. In some embodiments, the conductive bump 105 includes conductive material such as includes solder, copper, nickel, gold or etc. In some embodiments, the conductive bump 105 is a solder ball, a ball grid array (BGA) ball, controlled collapse chip connection (C4) bump, microbump, a pillar or the like. In some embodiments, the conductive bump 105 has a size of about 150 um to about 220 um.

In some embodiments, the through via 103 is disposed over the conductive member 104a. In some embodiments, the conductive pillar 104d is disposed over the conductive member 104a. In some embodiments, the conductive pillar 104d is disposed between the through via 103 and the conductive member 104a. In some embodiments, the conductive member 104a is disposed between the through via 103 and the conductive bump 105. In some embodiments, the conductive member 104a is disposed between the through via 103 and the conductive structure 104b or a part of the RDL 104. In some embodiments, the conductive member 104a is configured in a predetermined shape so as to minimize development of crack between the dielectric layer 104c, the molding 102 and the conductive member 104a.

FIGS. 2-5 illustrate schematic enlarged top views of a part 200 of the semiconductor structure 100 in FIG. 1. FIGS. 2-5 show top cross sections (cross sections from a top view of the semiconductor structure) of the conductive member 104a, the conductive pillar 104d and the through via 103 in the part 200. As illustrated in FIGS. 2-5, the conductive member 104a can be configured in different predetermined shapes. In some embodiments, the shape of the top cross section of the conductive member 104a is substantially different from the shape of the top cross section of the through via 103.

Figure 2:
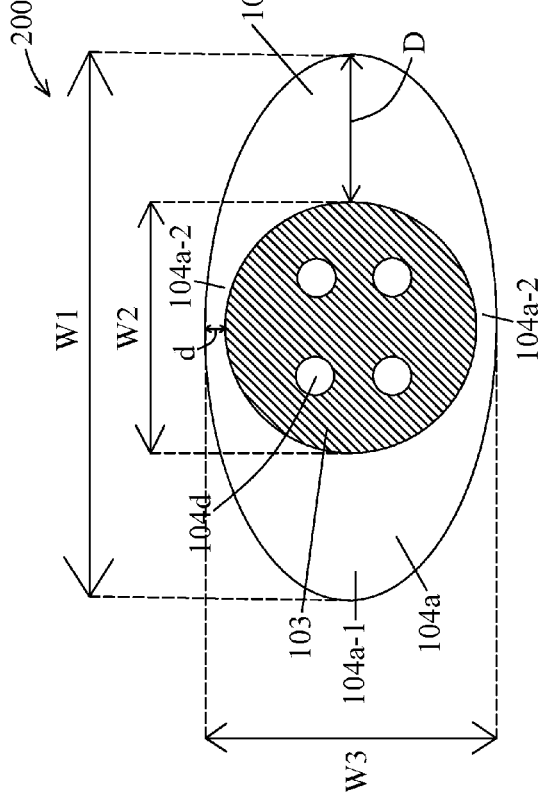
FIG. 2 is a schematic top cross sectional view (a cross sectional view from a top view of a semiconductor structure) of a portion of a semiconductor structure with a circular through via and an elliptical conductive member in accordance with some embodiments of the present disclosure.

In some embodiments as illustrated in FIG. 2, the top cross section of the conductive member 104a is in an oval or elliptical shape, while the top cross section of the through via 103 is in a circular shape. In some embodiments, an area of the top cross section of the conductive member 104a is substantially greater than an area of the top cross section of the through via 103, such that the top cross section of the through via 103 is disposed within or circumscribed by the top cross section of the conductive member 104a. In some embodiments, the conductive member 104a includes a longest length W1 and a shortest length W3. In some embodiments, the longest length W1 is a longest length of the top cross section of the conductive member 104a. In some embodiments, the shortest length W3 is a shortest length of the top cross section of the conductive member 104a. In some embodiments, the longest length W1 is substantially orthogonal to the shortest length W3. In some embodiments, the longest length W1 is substantially greater than the shortest length W3. In some embodiments, the longest length W1 and the shortest length W3 are substantially greater than a length W2 of the through via 103. In some embodiments, the longest length W1 of the conductive member 104a is greater than about 200 um. In some embodiments, the longest length W1 is about 180 um to about 250 um. In some embodiments, the length W2 of the through via 103 is about 180 um to about 200 um.

In some embodiments, the conductive member 104a includes a first protruding portion 104a-1 and a second protruding portion 104a-2, which are protruded from the through via 103. In some embodiments, the first protruding portion 104a-1 is laterally protruded from the through via 103 in a first direction. The conductive member 104a is elongated along the first direction. In some embodiments, the longest length W1 is substantially parallel to the first direction. In some embodiments, a portion of the dielectric layer 104c is disposed between the molding 102 and the first protruding portion 104a-1. In some embodiments, the second protruding portion 104a-2 is laterally protruded from the through via 103 in a second direction substantially orthogonal to the first direction. In some embodiments, the shortest length W3 is substantially parallel to the second direction. In some embodiments, a portion of the dielectric layer 104c is disposed between the molding 102 and the second protruding portion 104a-2. Referring back to FIG. 1, the first protruding portion 104a-1 is horizontally protruded from the through via 103 in the first direction towards the die 101, and the second protruding portion 104a-2 is protruded from the through via 103 in the second direction out of the FIG. 1.

In some embodiments, the first protruding portion 104a-1 is protruded from the through via 103 in a first length D along the first direction. In some embodiments, the first length D is substantially parallel to the longest length W1. In some embodiments, the second protruding portion 104a-2 is protruded from the through via 103 in a second length d along the second direction. In some embodiments, the second length d is substantially parallel to the shortest length W3. In some embodiments, the first length D is substantially greater than the second length d. In some embodiments, the first length D is substantially greater than about two times of the second length d. In some embodiments, the second length d is substantially greater than about 5 um.

Figure 3:
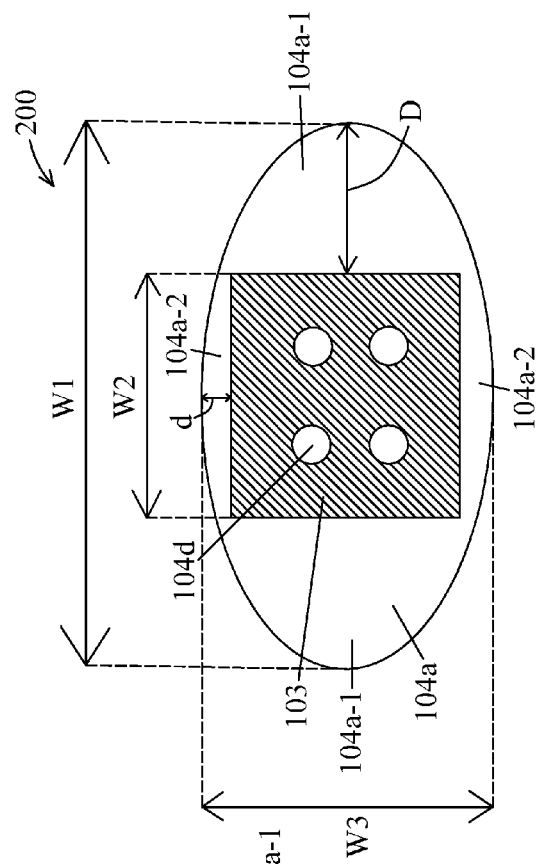
FIG. 3 is a schematic top cross sectional view (a cross sectional view from a top view of a semiconductor structure) of a portion of a semiconductor structure with a quadrilateral through via and an elliptical conductive member in accordance with some embodiments of the present disclosure.

In some embodiments as illustrated in FIG. 3, the top cross section of the conductive member 104a is in an oval or elliptical shape, while the top cross section of the through via 103 is in a quadrilateral or rectangular shape. In some embodiments, the area of the top cross section of the conductive member 104a is substantially greater than the area of the top cross section of the through via 103, such that the top cross section of the through via 103 is disposed within the top cross section of the conductive member 104a. In some embodiments, the conductive member 104a includes a longest length W1 and a shortest length W3. In some embodiments, the longest length W1 is substantially orthogonal to the shortest length W3. In some embodiments, the longest length W1 is substantially greater than the shortest length W3. In some embodiments, the longest length W1 and the shortest length W3 are substantially greater than a length W2 of the through via 103.

In some embodiments, the first protruding portion 104a-1 and the second protruding portion 104a-2 are protruded from the through via 103. In some embodiments, the first protruding portion 104a-1 is laterally protruded from the through via 103 in the first direction, and the second protruding portion 104a-2 is laterally protruded from the through via 103 in the second direction substantially orthogonal to the first direction. In some embodiments, the longest length W1 is substantially parallel to the first direction, and the shortest length W3 is substantially parallel to the second direction. In some embodiments, the first protruding portion 104a-1 is protruded from the through via 103 in the first length D along the first direction, and the second protruding portion 104a-2 is protruded from the through via 103 in the second length d along the second direction. In some embodiments, the first length D is substantially greater than the second length d. In some embodiments, the first length D is substantially parallel to the longest length W1, and the second length d is substantially parallel to the shortest length W3.

Figures 4, 5:
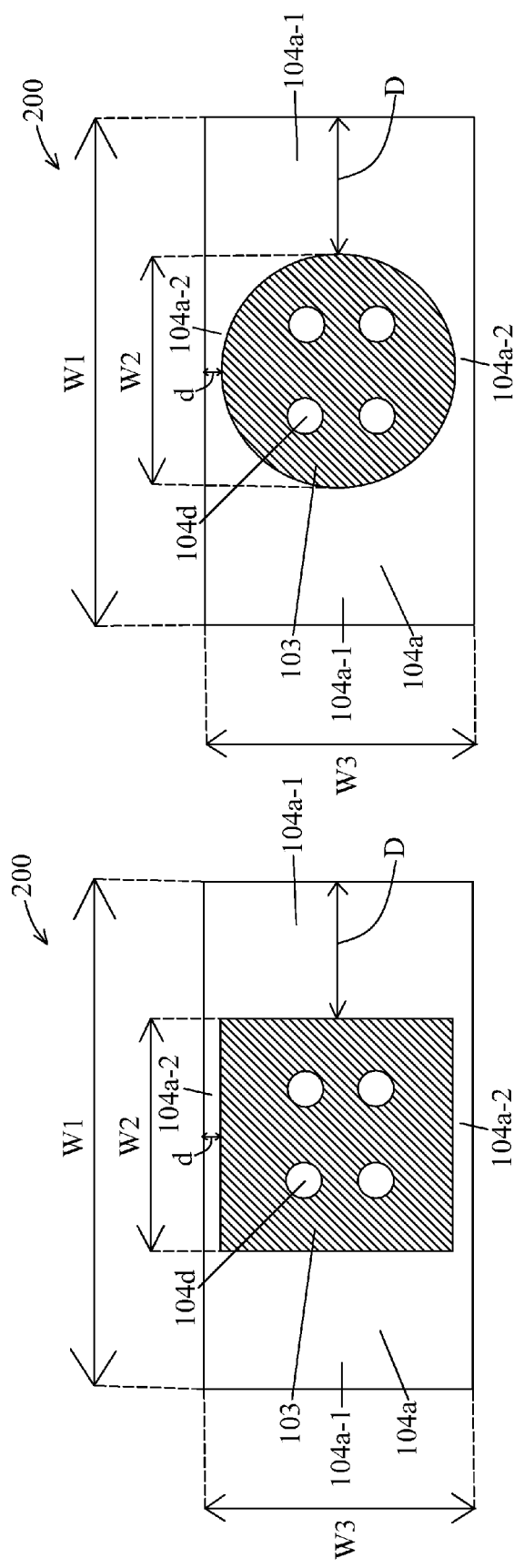
FIG. 4 is a schematic top cross sectional view (a cross sectional view from a top view of a semiconductor structure) of a portion of a semiconductor structure with a quadrilateral through via and a quadrilateral conductive member in accordance with some embodiments of the present disclosure.
FIG. 5 is a schematic top cross sectional view (a cross sectional view from a top view of a semiconductor structure) of a portion of a semiconductor structure with a circular through via and a quadrilateral conductive member in accordance with some embodiments of the present disclosure.

In some embodiments as illustrated in FIG. 4, the top cross sections of the conductive member 104a and the through via 103 are in quadrilateral or rectangular shape. In some embodiments as illustrated in FIG. 5, the top cross sections of the conductive member 104a is in a quadrilateral or rectangular shape, while and the through via 103 is in a circular shape. In some embodiments, the area of the top cross section of the conductive member 104a is substantially greater than the area of the top cross section of the through via 103, such that the top cross section of the through via 103 is disposed within the top cross section of the conductive member 104a. In some embodiments, the conductive member 104a includes a longest length W1 and a shortest length W3. In some embodiments, the longest length W1 is substantially orthogonal to the shortest length W3. In some embodiments, the longest length W1 is substantially greater than the shortest length W3. In some embodiments, the longest length W1 and the shortest length W3 are substantially greater than the length W2 of the through via 103. In some embodiments, the first protruding portion 104a-1 and the second protruding portion 104a-2 are protruded from the through via 103. In some embodiments, the first protruding portion 104a-1 is laterally protruded from the through via 103 in the first direction, and the second protruding portion 104a-2 is laterally protruded from the through via 103 in the second direction substantially orthogonal to the first direction. In some embodiments, the longest length W1 is substantially parallel to the first direction, and the shortest length W3 is substantially parallel to the second direction. In some embodiments, the first protruding portion 104a-1 is protruded from the through via 103 in the first length D along the first direction, and the second protruding portion 104a-2 is protruded from the through via 103 in the second length d along the second direction. In some embodiments, the first length D is substantially greater than the second length d. In some embodiments, the first length D is substantially parallel to the longest length W1, and the second length d is substantially parallel to the shortest length W3.

Figure 6:
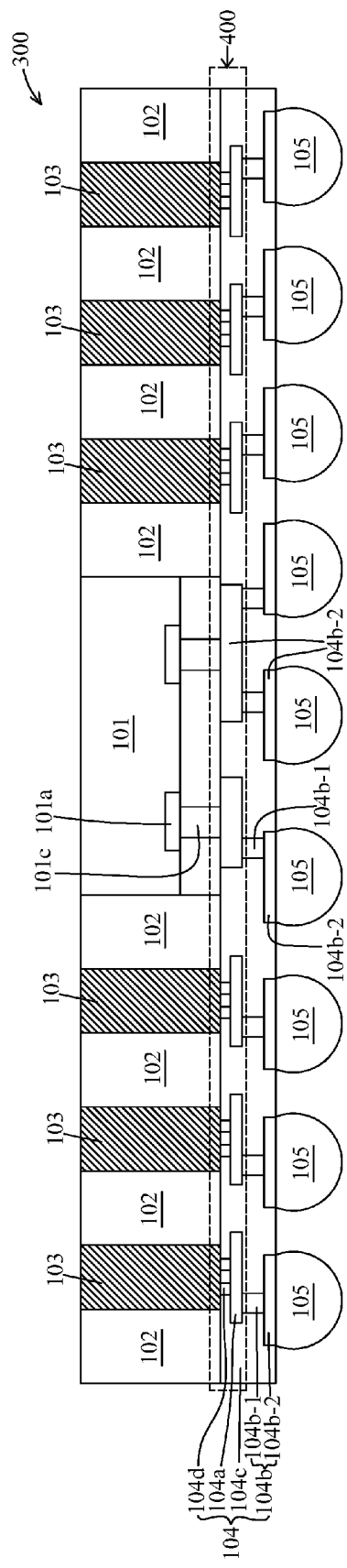
FIG. 6 is a schematic cross sectional view of a semiconductor structure in accordance with some embodiments of the present disclosure.

FIG. 6 is a schematic cross sectional view of a semiconductor structure 300 in accordance with various embodiments of the present disclosure. In some embodiments, the semiconductor structure 300 includes a die 101, a die pad 101a, a passivation layer 101b, a conductive post 101c, a molding 102, a through via 103, a redistribution layer (RDL) 104, a conductive member 104a, a conductive pillar 104d, a conductive structure 104b, a dielectric layer 104c and a conductive bump 105, which have similar configurations as described above and illustrated in any one of FIGS. 1-5. In some embodiments, the semiconductor structure 300 is a semiconductor package. In some embodiments, the semiconductor structure 300 is an integrated fan out (InFO) package.

In some embodiments, the semiconductor structure 300 includes several through vias 103 surrounding the die 101 and several conductive members 104a disposed over the through vias 103 correspondingly. In some embodiments, each of the conductive members 104a has a top cross sectional area (a cross sectional area from a top view of the semiconductor structure) substantially greater than a top cross sectional area (a cross sectional area from a top view of the semiconductor structure) of each of the through vias 103. The top cross sectional area of the through via 103 is disposed within the top cross sectional area of the through via 103. In some embodiments, some of the conductive members 104a in the semiconductor structure 300 are configured in predetermined shapes and/or oriented in predetermined orientations, so as to minimize development of crack between the dielectric layer 104c, the molding 102 and the conductive member 104a.

Figure 7:
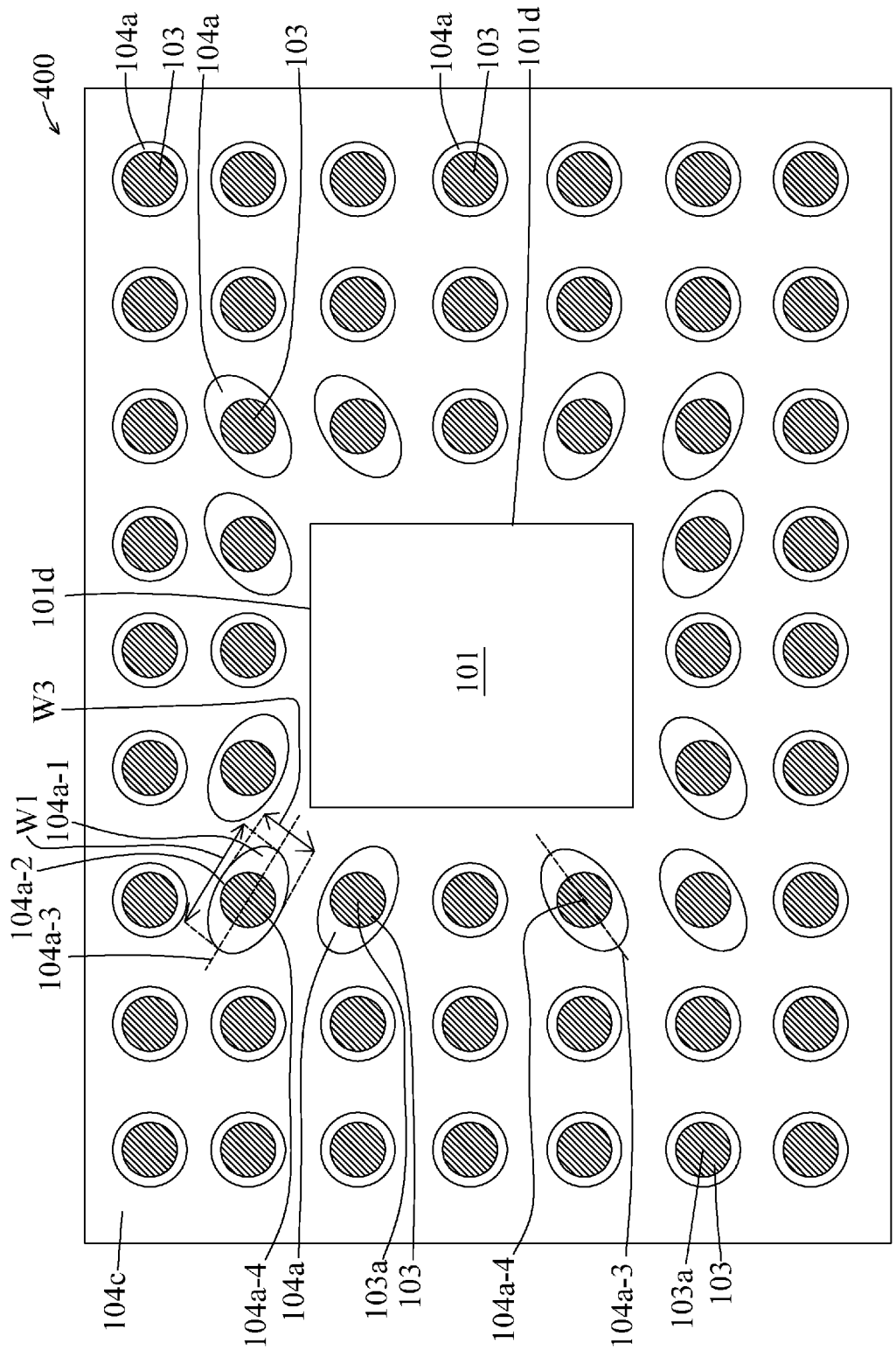
FIG. 7 is a schematic top cross sectional view (a cross sectional view from a top view of a semiconductor structure) of a portion of a semiconductor structure with a conductive member disposed adjacent to a corner of a die in accordance with some embodiments of the present disclosure.
Figure 8:
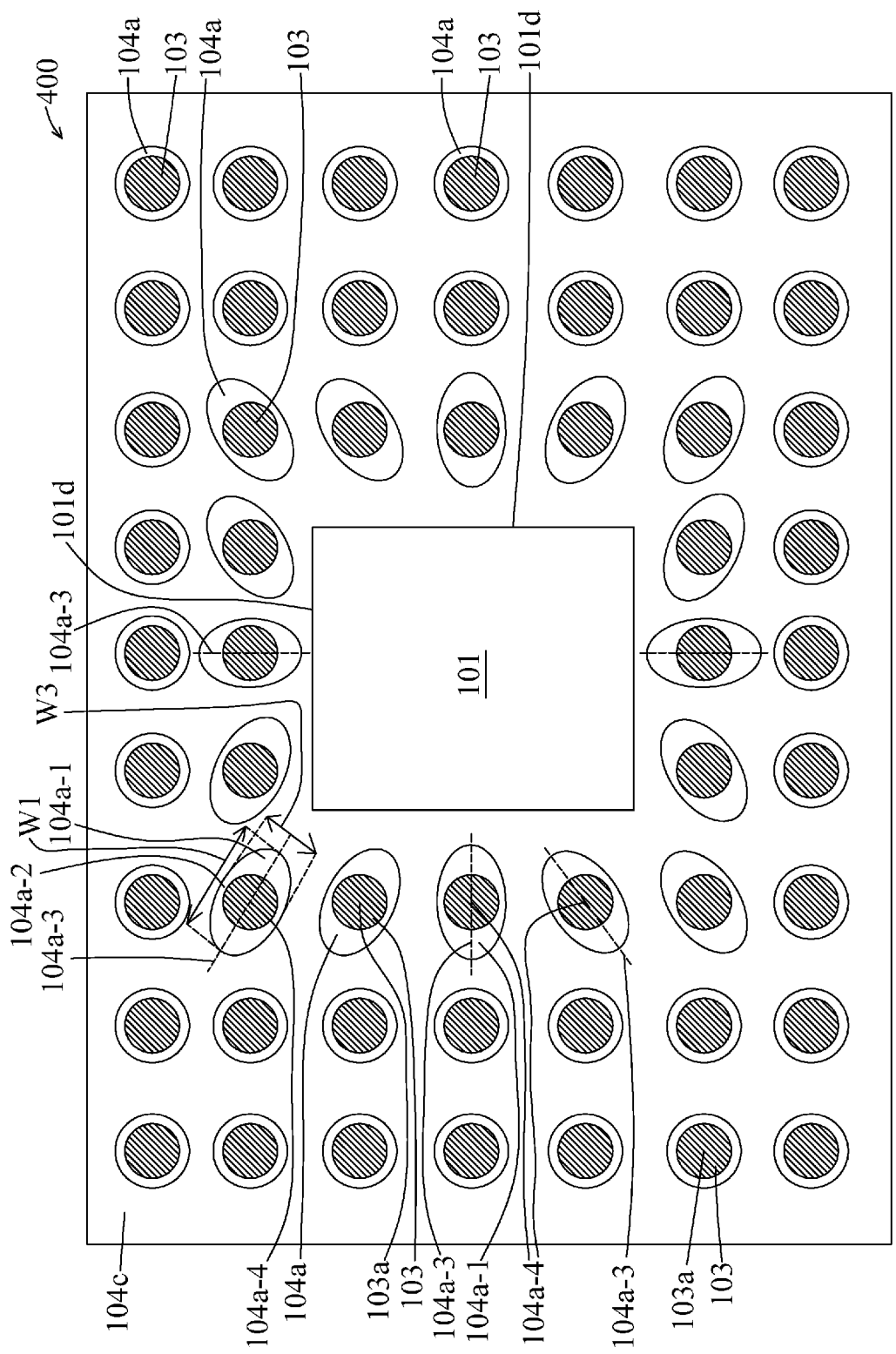
FIG. 8 is a schematic top cross sectional view (a cross sectional view from a top view of a semiconductor structure) of a portion of a semiconductor structure with a conductive member disposed adjacent to an edge of a die in accordance with some embodiments of the present disclosure.
Figure 9:
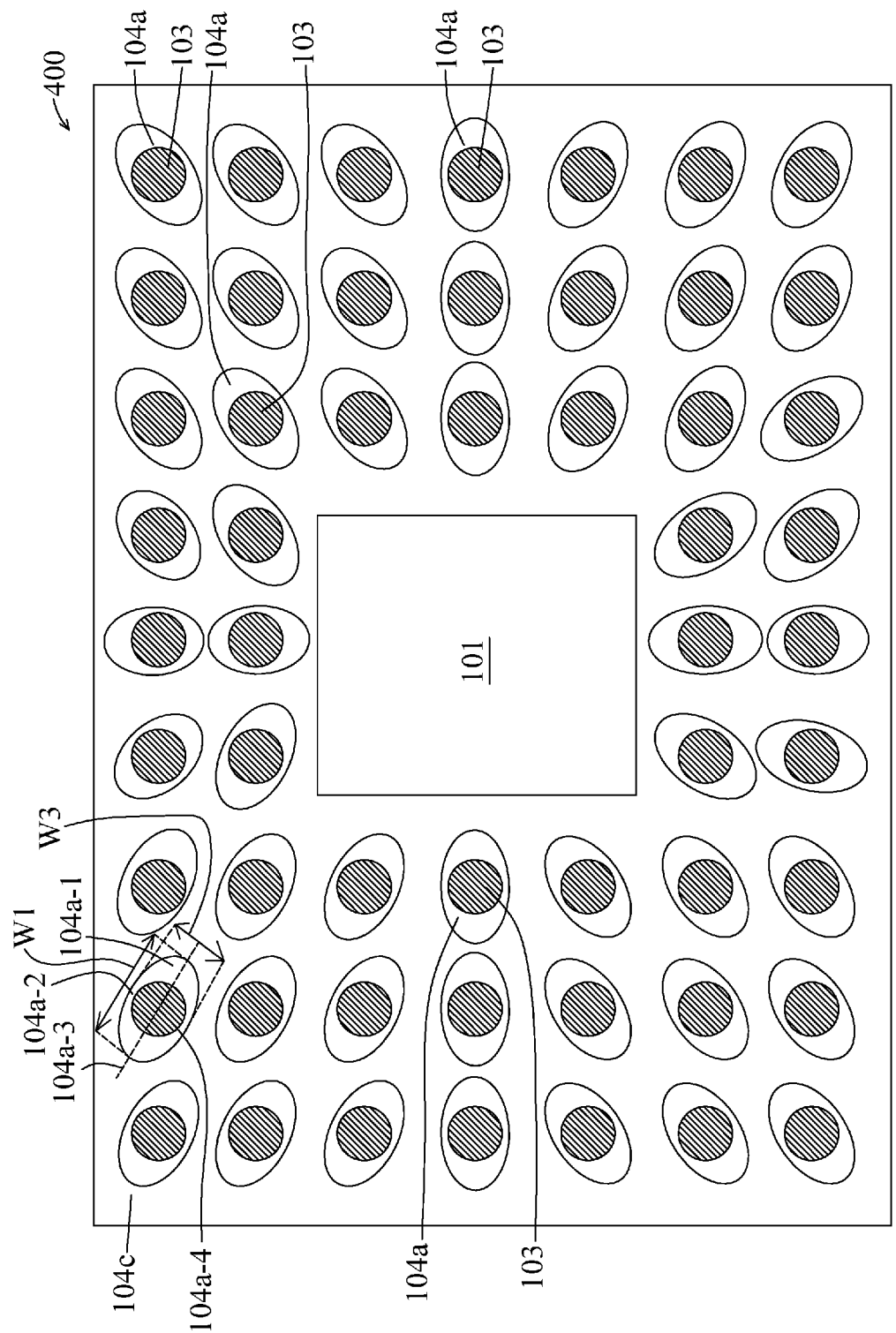
FIG. 9 is a schematic top cross sectional view (a cross sectional view from a top view of a semiconductor structure) of a portion of a semiconductor structure with a conductive member disposed in the semiconductor structure in accordance with some embodiments of the present disclosure.

FIGS. 7-9 illustrate schematic enlarged top views of a part 400 of the semiconductor structure 300 in FIG. 6. FIGS. 7-9 show top cross sections (cross sections from a top view of the semiconductor structure) of the conductive member 104a, the through via 103 and the dielectric layer 104c in the part 400. As illustrated in FIGS. 7-9, some of the conductive members 104a can be configured in a predetermined shape different from rest of the conductive members 104a.

In some embodiments as shown in FIG. 7, the conductive members 104a disposed adjacent to a corner of the die 101 is configured in the oval or elliptical shape as described above or illustrated in FIG. 2 or 3. The shapes of the conductive members 104a disposed adjacent to the corner of the die 101 are substantially different from the shapes of the rest of the conductive members 104a in the semiconductor structure 300. As shown in FIG. 7, the conductive members 104a disposed adjacent to the corner of the die 101 are in the elliptical shape, while the rest of the conductive members 104a are in circular shape.

In some embodiments, the conductive member 104a disposed adjacent to the corner of the die 101 includes an axis 104a-3. In some embodiments, the axis 104a-3 passes through the first protruding portion 104a-1 and is parallel to the first direction and the longest length W1. In some embodiments, the axis 104a-3 passes through the first protruding portion 104a-1 and a center 104a-4 of the conductive member 104a. In some embodiments, the center 104a-4 of the conductive member 104a is common with a center 103a of the through via 103. In some embodiments, the axis 104a-3 passes through the center 104a-4 of the conductive member 104a. In some embodiments, the axis 104a-3 is along the longest length W1 of the conductive member 104a. In some embodiments, the axis 104a-3 is directed towards the die 101. In some embodiments, the axis 104a-3 is oriented pointing to the die 101. In some embodiments, the axis 104a-3 is oriented passing through a center or a central portion of the die 101. In some embodiments, the axis 104a-3 is oriented in an angle relative to an edge 101d of the die 101. In some embodiments, the angle between the axis 104a-3 and the edge 101d of the die 101 is about 20° to about 80°. In some embodiments, the angle is about 35° to about 65°. In some embodiments, the angle is about 45° or 90°.

In some embodiments as shown in FIG. 8, the conductive members 104a disposed adjacent to the edge 101d of the die 101 is configured in the oval or elliptical shape as described above or illustrated in FIG. 2 or 3. The shapes of the conductive members 104a disposed adjacent to the edge 101d of the die 101 are substantially different from the shapes of the rest of the conductive members 104a in the semiconductor structure 300. As shown in FIG. 8, the conductive members 104a disposed adjacent to the edge 101d of the die 101 are in the elliptical shape, while the rest of the conductive members 104a are in circular shape.

In some embodiments, the conductive member 104a disposed adjacent to the edge 101d of the die 101 includes the axis 104a-3 passing through the first protruding portion 104a-1 and is parallel to the first direction and the longest length W1. In some embodiments, the axis 104a-3 passes through the first protruding portion 104a-1 and the center 104a-4 of the conductive member 104a. In some embodiments, the center 104a-4 of the conductive member 104a is common with the center 103a of the through via 103. In some embodiments, the axis 104a-3 is along the longest length W1 of the conductive member 104a. In some embodiments, the axis 104a-3 is directed towards the die 101. In some embodiments, the axis 104a-3 is oriented pointing to the die 101. In some embodiments, the axis 104a-3 is oriented passing through the center or the central portion of the die 101. In some embodiments, the axis 104a-3 is oriented in the angle relative to an edge 101d of the die 101. In some embodiments, the angle between the axis 104a-3 and the edge 101d of the die 101 is about 20° to about 80°. In some embodiments, the angle is about 35° to about 65°. In some embodiments, the angle is about 45° or 90°.

In some embodiments as shown in FIG. 9, all of the conductive members 104a in the semiconductor structure 300 are configured in the oval or elliptical shape as described above or illustrated in FIG. 2 or 3. In some embodiments, the conductive member 104a includes the axis 104a-3 passing through the first protruding portion 104a-1 and is parallel to the first direction and the longest length W1. In some embodiments, the axis 104a-3 passes through the first protruding portion 104a-1 and the center 104a-4 of the conductive member 104a. In some embodiments, the center 104a-4 of the conductive member 104a is common with the center 103a of the through via 103. In some embodiments, the axis 104a-3 is along the longest length W1 of the conductive member 104a. In some embodiments, the axis 104a-3 is directed towards the die 101. In some embodiments, the axis 104a-3 is oriented pointing to the die 101. In some embodiments, the axis 104a-3 is oriented passing through the center or the central portion of the die 101. In some embodiments, the axis 104a-3 is oriented in the angle relative to an edge 101d of the die 101. In some embodiments, the angle between the axis 104a-3 and the edge 101d of the die 101 is about 20° to about 80°. In some embodiments, the angle is about 35° to about 65°. In some embodiments, the angle is about 45° or 90°.

Figure 10:
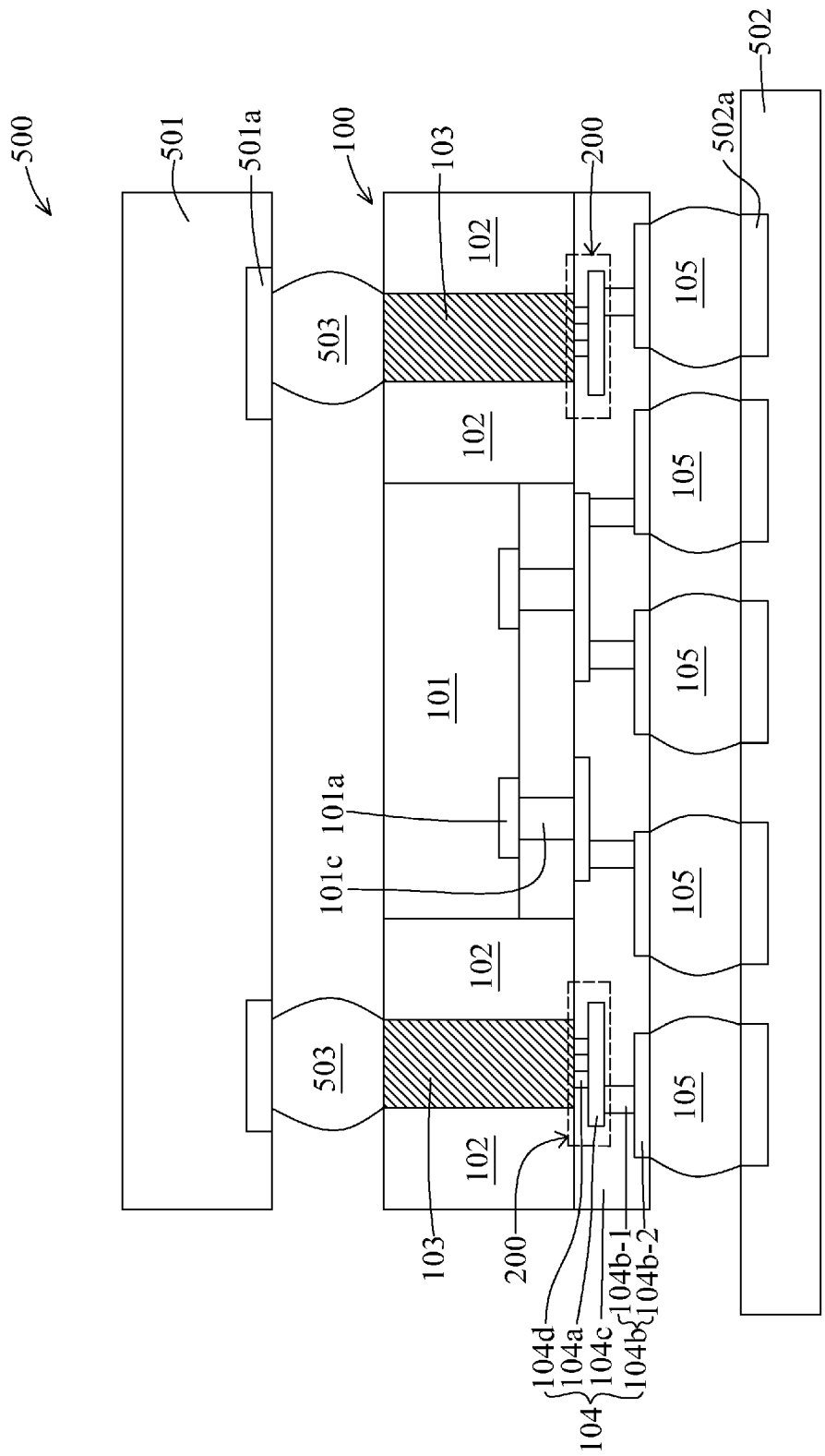
FIG. 10 is a schematic cross sectional view of a semiconductor package in accordance with some embodiments of the present disclosure.

FIG. 10 is a schematic cross sectional view of a semiconductor package 500 in accordance with various embodiments of the present disclosure. In some embodiments, the semiconductor package 500 includes the semiconductor structure 100, a first chip 501 and a second chip 502. In some embodiments, the semiconductor structure 100 has similar configuration as described above or as illustrated in any one of FIGS. 1-9.

In some embodiments, the first chip 501 includes semiconductive material such as silicon, etc. In some embodiments, the first chip 501 includes semiconductive device such as transistor, diode, etc. In some embodiments, the first chip 501 is a Dynamic Random Access Memory (DRAM) chip, memory chip or the like. In some embodiments, the first chip 501 is disposed over and bonded with the semiconductor structure 100, so that a circuitry of the first chip 501 is integrated with a circuitry of the semiconductor structure 100. In some embodiments, the through via 103 is electrically connected with a bond pad 501a of the first chip 501 by a connector 503 disposed between the first chip 501 and the semiconductor structure 100. In some embodiments, the bond pad 501a is configured to receive the connector 503. In some embodiments, the connector 503 is directly disposed on the through via 103 or is disposed on a pad over the through via 103.

In some embodiments, the second chip 502 includes semiconductive material such as silicon, etc. In some embodiments, the second chip 502 includes semiconductive device such as transistor, diode, etc. In some embodiments, the second chip 502 is a device chip, a package or a printed circuit board (PCB). In some embodiments, the first chip 501 and the semiconductor structure 100 are stacked and disposed over the second chip 502. In some embodiments, the semiconductor structure 100 is bonded with the second chip 502, so that the circuitry of the semiconductor structure 100 is integrated with a circuitry of the second chip 502. In some embodiments, the circuitry of the semiconductor structure 100, the circuitry of the first chip 501 and the circuitry of the second chip 502 are integrated. In some embodiments, the conductive bump 105 of the semiconductor structure 100 is bonded over the second chip 502. In some embodiments, the conductive bump 105 is bonded with a bond pad 502a of the second chip 502, such that the conductive structure 104b or the land portion 104b-2 is electrically connected with the bond pad 502a of the second chip 502. In some embodiments, the bond pad 502a is configured to receive the conductive bump 105.

Figure 11:
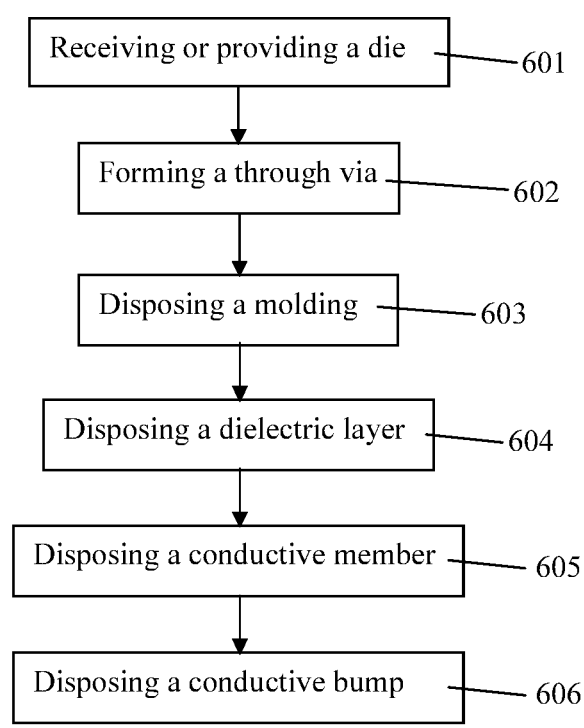
FIG. 11 is a flow diagram of a method of manufacturing a semiconductor structure in accordance with some embodiments of the present disclosure.

In the present disclosure, a method of manufacturing a semiconductor structure 100 is also disclosed. In some embodiments, a semiconductor structure 100 is formed by a method 600. The method 600 includes a number of operations and the description and illustration are not deemed as a limitation as the sequence of the operations. FIG. 11 is an embodiment of a method 600 of manufacturing a semiconductor structure 100. The method 600 includes a number of operations (601, 602, 603, 604, 605 and 606).

In operation 601, a die 101 is received or provided as shown in FIG. 11A. In some embodiments, the die 101 is disposed over a substrate 701. In some embodiments, the die 101 has similar configuration as described above or illustrated in any one of FIGS. 1, 6-10. In some embodiments, the substrate 701 is a carrier substrate for temporarily supporting the die 101 and other components subsequently disposed thereon. In some embodiments, the substrate 701 is a wafer. In some embodiments, the substrate 701 includes silicon, glass, ceramic or the like. In some embodiments, the die 101 is temporarily attached to the substrate 701 by an adhesive such as glue, tape, etc.

In operation 602, a through via 103 is formed over the substrate 701 as shown in FIG. 11B. In some embodiments, the through via 103 is formed by disposing a photoresist over the substrate 701, patterning the photoresist to include a recess, and disposing a conductive material into the recess, and then removing the photoresist from the substrate 701. In some embodiments, the conductive material is disposed by electroplating, electroless plating or other suitable operations. In some embodiments, the conductive material includes gold, silver, copper, nickel, tungsten, aluminum, tin and/or alloys thereof. In some embodiments, the through via 103 has similar configuration as described above or illustrated in any one of FIGS. 1-10. In some embodiments, the through via 103 is formed adjacent to the die 101.

Figure 11C:
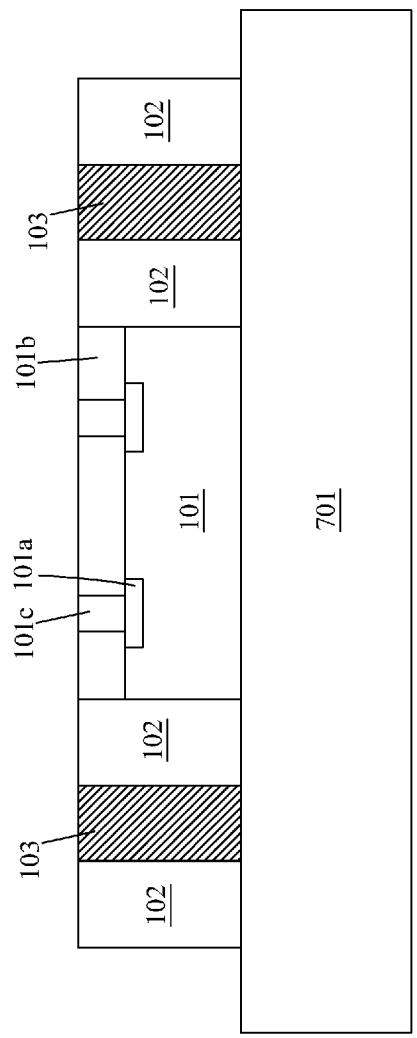

In operation 603, a molding 102 is disposed over the substrate 701 and around the die 101 and the through via 103 as shown in FIG. 11C. In some embodiments, the molding 102 is formed by disposing a molding material over the substrate 701, the die 101 and the through via 103, and then grinding the molding material to thin down the molding material until exposing the die 101 and the through via 103. In some embodiments, the molding material is disposed between the die 101 and the through via 103. In some embodiments, the molding 102 is formed to surround the die 101 and the through via 103. In some embodiments, the through via 103 is extended through the molding 102. In some embodiments, the molding 102 has similar configuration as described above or illustrated in any one of FIGS. 1, 6, 10.

Figure 11D:
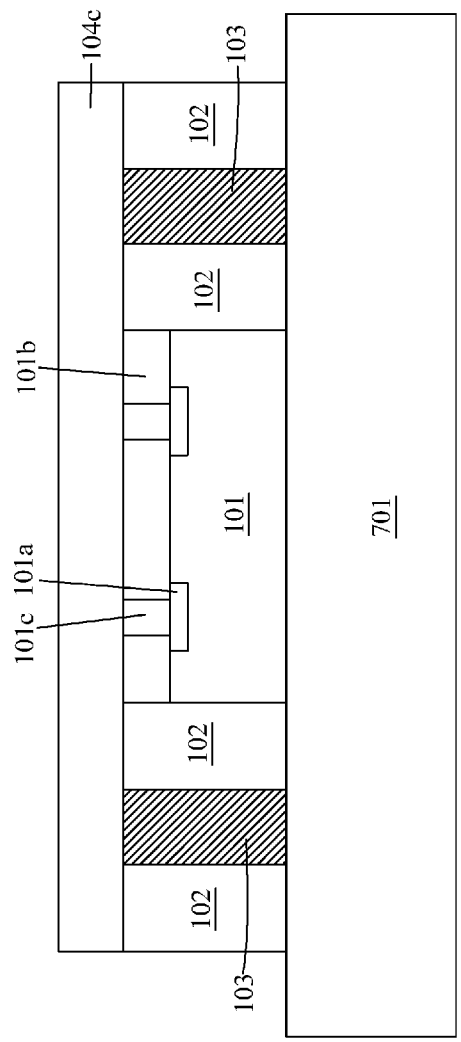

In operation 604, a dielectric layer 104c is disposed over the die 101, the molding 102 and the through via 103 as shown in FIG. 11D. In some embodiments, the disposition of the dielectric layer 104c is a part of operations of forming a redistribution layer (RDL) 104 over the die 101, the molding 102 and the through via 103. In some embodiments, the dielectric layer 104c is disposed by spin coating, chemical vapor deposition (CVD) or any other suitable operations. In some embodiments, the dielectric layer 104c is disposed and then patterned by photolithography and etching operations. In some embodiments, a predetermined portion of the dielectric layer 104c is removed, so as to expose the through via 103 for electrical connection with the die 101 in later operations. In some embodiments, the dielectric layer 104c includes one or more layers of dielectric materials. In some embodiments, the dielectric layer 104c has similar configuration as described above or illustrated in any one of FIGS. 1, 6-10.

Figure 11E:
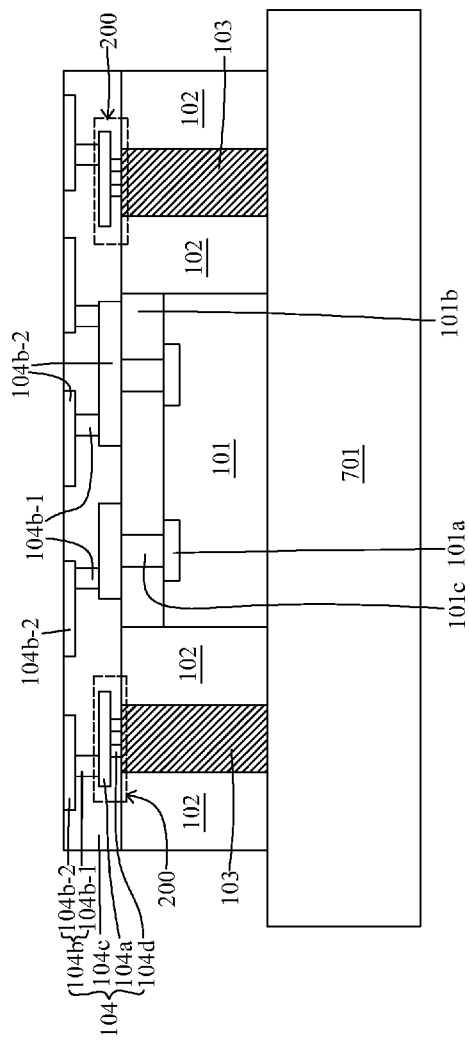

In operation 605, a conductive member 104a is disposed over the through via 103 and within the dielectric layer 104c as shown in FIG. 11E. In some embodiments, the conductive member 104a is formed by disposing a conductive material within the predetermined portion of the dielectric layer 104c being removed. In some embodiments, the conductive material includes copper, gold, silver, etc. In some embodiments, the conductive member 104a is disposed by electroplating or other suitable operations. In some embodiments, the disposition of the conductive member 104a is a part of the operations of forming the RDL 104 over the die 101, the molding 102 and the through via 103. In some embodiments, the conductive member 104a has similar configuration as described above or illustrated in any one of FIGS. 1-10. In some embodiments, the conductive member 104a has an oval or elliptical shape.

In some embodiments, a conductive pillar 104d is formed within the dielectric layer 104c. In some embodiments, the conductive pillar 104d is disposed between the through via 103 and the conductive member 104a. In some embodiments, the conductive member 104a is disposed by electroplating or other suitable operations. In some embodiments, the conductive pillar 104d is formed by disposing the conductive material within the predetermined portion of the dielectric layer 104c being removed. In some embodiments, the conductive pillar 104d includes same or different material from the conductive member 104a. In some embodiments, the conductive member 104a and the conductive pillar 104d are formed at the same time or are formed separately. In some embodiments, the conductive member 104a is integrally formed with the conductive pillar 104d. In some embodiments, the formation of the conductive pillar 104d is a part of the operations of forming the RDL 104 over the die 101, the molding 102 and the through via 103. In some embodiments, the conductive pillar 104d has similar configuration as described above or illustrated in any one of FIGS. 1, 6, 10.

In some embodiments, a conductive structure 104b including a via portion 104b-1 and a land portion 104b-2 is formed within the dielectric layer 104c. In some embodiments, the conductive structure 104b is disposed over the die 101, the through via 103 or the conductive member 104a. In some embodiments, the conductive member 104a is disposed by electroplating or other suitable operations. In some embodiments, the conductive structure 104b is formed by disposing the conductive material within the predetermined portion of the dielectric layer 104c being removed. In some embodiments, the formation of the conductive structure 104b is a part of the operations of forming the RDL 104 over the die 101, the molding 102 and the through via 103. In some embodiments, the conductive structure 104b has similar configuration as described above or illustrated in any one of FIGS. 1, 6, 10.

Figure 11F:
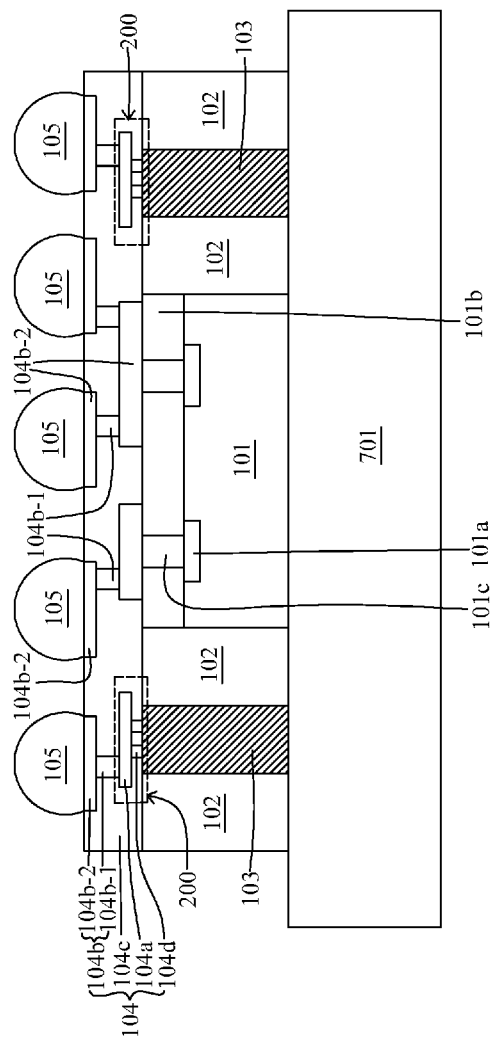

In operation 606, a conductive bump 105 is disposed over the conductive structure 104b and the dielectric layer 104c as shown in FIG. 11F. In some embodiments, the conductive bump 105 is disposed over the land portion 104b-2 of the conductive structure 104b. In some embodiments, a UBM pad is disposed over the land portion 104b-2, and the conductive bump 105 is disposed on the UBM pad. In some embodiments, the conductive bump 105 is disposed over the land portion 104b-2 or the UBM pad by ball dropping, solder pasting, stencil printing or other suitable operations. In some embodiments, the conductive bump 105 undergoes thermal or reflowing operations after disposing over the land portion 104b-2 or the UBM pad. In some embodiments, the conductive bump 105 has similar configuration as described above or illustrated in any one of FIGS. 1, 6, 10.

Figure 11G:
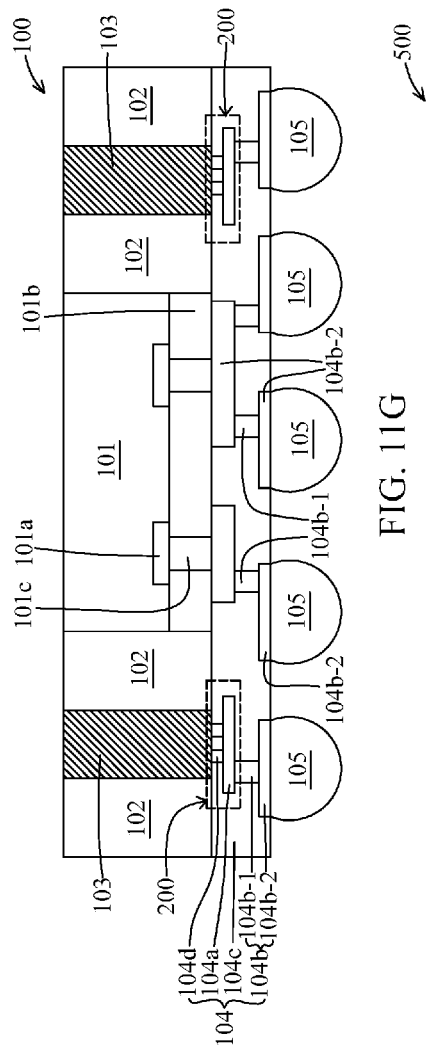
Figure 11H:
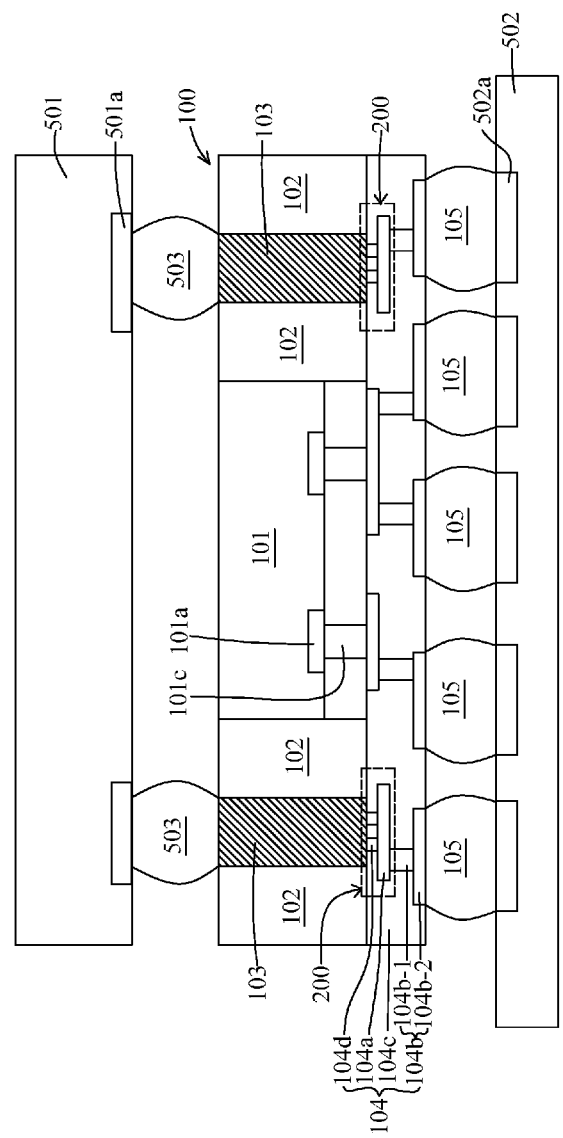

In some embodiments, the substrate 701 is detached and removed from the die 101, the through via 103 and the molding 102, and then become a semiconductor structure 100 as shown in FIG. 11G. In some embodiments, the semiconductor structure 100 has similar configuration as described above or illustrated in FIG. 1 or 6. In some embodiments, the semiconductor structure 100 can bonded with a first chip 501 or a second chip 502 as shown in FIG. 11H. In some embodiments, the first chip 501 is stacked over and bonded with the semiconductor structure 100 by a connector 503. In some embodiments, the semiconductor structure 100 is stacked over and bonded with the second chip 502 by the conductive bump 105. In some embodiments, the first chip 501 and the second chip have similar configuration as described above or illustrated in FIG. 10. In some embodiments, the semiconductor structure 100 is bonded with the first chip 501 and the second chip 502 to become a semiconductor package 500 as shown in FIG. 11H or 10.

In the present disclosure, a semiconductor structure with improvement is disclosed. The semiconductor structure includes a conductive member electrically connected with and disposed over a through via with a predetermined shape or in a predetermined orientation. The conductive member includes a first protruding portion and a second protruding portion protruded from the through via. The first protruding portion is protruded in a length greater than the second protruding portion. The conductive member is in an oval or elliptical shape. Further, an axis of the conductive member passing through the first protruding portion is oriented pointing towards the die. The axis is tilted relative to an edge of the die in an angle. Such configuration of the conductive member can reduce an internal stress of the semiconductor structure, and thus minimize or prevent a development of crack around the conductive member.

In some embodiments, a semiconductor structure includes a through via, a molding surrounding the through via, a dielectric layer disposed over the through via and the molding, and a conductive member disposed within the dielectric layer, disposed over the through via, and electrically connected with the through via, wherein the conductive member includes a first protruding portion and a second protruding portion, and the first protruding portion is laterally protruded from the through via along a first direction in a first length, and the second protruding portion is laterally protruded from the through via along a second direction in a second length, and the first direction is substantially orthogonal to the second direction, and the first length is substantially greater than the second length.

In some embodiments, a top cross section of the conductive member is in a shape substantially different from a top cross section of the through via, or the top cross section of the through via is in a circular shape and the top cross section of the conductive member is in an oval or elliptical shape. In some embodiments, the conductive member includes a longest length and a shortest length substantially orthogonal to the longest length, and the longest length is parallel to the first direction, and the shortest length is parallel to the second direction. In some embodiments, a top cross sectional area of the conductive member is substantially greater than a top cross sectional area of the through via. In some embodiments, the first length is substantially greater than about 2 times of the second length, or the second length is substantially greater than about 5 um. In some embodiments, a portion of the dielectric layer is disposed between the molding and the first protruding portion. In some embodiments, the semiconductor structure further includes a conductive pillar disposed between and electrically coupled with the through via and the conductive member, or the conductive pillar is integrally formed with the conductive member. In some embodiments, the semiconductor structure further includes a conductive bump disposed over the dielectric layer, or a conductive structure disposed within the dielectric layer and electrically connected with the conductive member and the conductive bump. In some embodiments, the through via is a through integrated fan out through via (TIV) extending through the molding. In some embodiments, the conductive member includes copper, or the conductive member includes same material as the through via.

In some embodiments, a semiconductor structure includes a die, a through via disposed adjacent to the die, a molding surrounding the die and the through via, and a redistribution layer (RDL) disposed over the die, the molding and the through via, wherein the RDL includes a dielectric layer and a conductive member disposed within the dielectric layer, the dielectric layer is disposed over the die, the molding and the through via, the conductive member is disposed over and electrically connected with the through via, an area of a top cross section of the conductive member is substantially greater than an area of a top cross section of the through via, and the conductive member includes an axis parallel to a longest length of the top cross section of the conductive member and pointing towards the die.

In some embodiments, the axis is oriented pointing towards a center or a central portion of the die. In some embodiments, the conductive member is disposed adjacent to a corner of the die or an edge of the die. In some embodiments, an angle between the axis and an edge of the die is about 45°. In some embodiments, a portion of the conductive member is protruded from the through via along the longest length of the top cross section of the conductive member. In some embodiments, the axis passes through a center of the conductive member common with a center of the through via. In some embodiments, the die is electrically connected with another die through the through via and the conductive member. In some embodiments, the longest length of the top cross section of the conductive member is about 180 um to about 250 um.

In some embodiments, a method of manufacturing a semiconductor structure includes providing a die, forming a through via adjacent to the die, disposing a molding around the die and the through via, disposing a dielectric layer over the molding, the through via and the die, and forming a conductive member over the through via to electrically connect with the through via, wherein the conductive member includes a first protruding portion and a second protruding portion, and the first protruding portion is laterally protruded from the through via along a first direction in a first length, and the second protruding portion is laterally protruded from the through via along a second direction in a second length, and the first length is substantially greater than the second length, and the first direction is substantially orthogonal to the second direction.

In some embodiments, the forming the conductive member includes forming the first protruding portion and the second protruding portion over a portion of the dielectric layer. In some embodiments, the forming the conductive member includes forming a conductive pillar extending through the dielectric layer and electrically connecting with the through via and the conductive member.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A semiconductor structure, comprising:
   a through via;
   a molding surrounding the through via;
   a dielectric layer disposed over the through via and the molding; and
   a conductive member disposed within the dielectric layer, disposed over the through via, and electrically connected with the through via,
   wherein the conductive member includes a first protruding portion and a second protruding portion, and the first protruding portion is laterally protruded from the through via along a first direction in a first length, and the second protruding portion is laterally protruded from the through via along a second direction in a second length, and the first direction is substantially orthogonal to the second direction, and the first length is substantially greater than the second length.

2. The semiconductor structure of claim 1, wherein a top cross section of the conductive member is in a shape substantially different from a top cross section of the through via, or the top cross section of the through via is in a circular shape and the top cross section of the conductive member is in an oval or elliptical shape.

3. The semiconductor structure of claim 1, wherein the conductive member includes a longest length and a shortest length substantially orthogonal to the longest length, and the longest length is parallel to the first direction, and the shortest length is parallel to the second direction.

4. The semiconductor structure of claim 1, wherein a top cross sectional area of the conductive member is substantially greater than a top cross sectional area of the through via.

5. The semiconductor structure of claim 1, wherein the first length is substantially greater than about 2 times of the second length, or the second length is substantially greater than about 5 um.

6. The semiconductor structure of claim 1, wherein a portion of the dielectric layer is disposed between the molding and the first protruding portion.

7. The semiconductor structure of claim 1, further comprising a conductive pillar disposed between and electrically coupled with the through via and the conductive member, or the conductive pillar is integrally formed with the conductive member.

8. The semiconductor structure of claim 1, further comprising:
   a conductive bump disposed over the dielectric layer; or
   a conductive structure disposed within the dielectric layer and electrically connected with the conductive member and the conductive bump.

9. The semiconductor structure of claim 1, wherein the through via is a through integrated fan out through via (TIV) extending through the molding.

10. The semiconductor structure of claim 1, wherein the conductive member includes copper, or the conductive member includes same material as the through via.

11. A semiconductor structure, comprising:
a die;
a through via disposed adjacent to the die;
a molding surrounding the die and the through via; and
a redistribution layer (RDL) disposed over the die, the molding and the through via,
wherein the RDL includes a dielectric layer and a conductive member disposed within the dielectric layer, the dielectric layer is disposed over the die, the molding and the through via, the conductive member is disposed over and electrically connected with the through via, an area of a top cross section of the conductive member is substantially greater than an area of a top cross section of the through via, and the conductive member includes an axis parallel to a longest length of the top cross section of the conductive member and pointing towards the die.

12. The semiconductor structure of claim 11, wherein the axis is oriented pointing towards a center or a central portion of the die.

13. The semiconductor structure of claim 11, wherein the conductive member is disposed adjacent to a corner of the die or an edge of the die.

14. The semiconductor structure of claim 11, wherein an angle between the axis and an edge of the die is about 45°.

15. The semiconductor structure of claim 11, wherein a portion of the conductive member is protruded from the through via along the longest length of the top cross section of the conductive member.

16. The semiconductor structure of claim 11, wherein the axis passes through a center of the conductive member common with a center of the through via.

17. The semiconductor structure of claim 11, wherein the longest length of the top cross section of the conductive member is about 180 um to about 250 um.

18. A method of manufacturing a semiconductor structure, comprising:
providing a die;
forming a through via adjacent to the die;
disposing a molding around the die and the through via;
disposing a dielectric layer over the molding, the through via and the die; and
forming a conductive member over the through via to electrically connect with the through via,
wherein the conductive member includes a first protruding portion and a second protruding portion, and the first protruding portion is laterally protruded from the through via along a first direction in a first length, and the second protruding portion is laterally protruded from the through via along a second direction in a second length, and the first length is substantially greater than the second length, and the first direction is substantially orthogonal to the second direction.

19. The method of claim 18, wherein the forming the conductive member includes forming the first protruding portion and the second protruding portion over a portion of the dielectric layer.

20. The method of claim 18, wherein the forming the conductive member includes forming a conductive pillar extending through the dielectric layer and electrically connecting with the through via and the conductive member.

* * * * *